(12) United States Patent
Tadano

(10) Patent No.: US 8,896,382 B2
(45) Date of Patent: Nov. 25, 2014

(54) AMPLIFICATION DEVICE AND AMPLIFICATION METHOD

(71) Applicant: Fujitsu Limited, Kawasaki-shi (JP)

(72) Inventor: Tsuneaki Tadano, Sendai (JP)

(73) Assignee: Fujitsu Limited, Kawasaki (JP)

( * ) Notice: Subject to any disclaimer, the term of this patent is extended or adjusted under 35 U.S.C. 154(b) by 68 days.

(21) Appl. No.: 13/716,130

(22) Filed: Dec. 15, 2012

(65) Prior Publication Data
US 2013/0207726 A1    Aug. 15, 2013

(30) Foreign Application Priority Data

Feb. 15, 2012   (JP) .................................. 2012-030046

(51) Int. Cl.
| | |
|---|---|
| *H03F 3/04* | (2006.01) |
| *H03F 3/68* | (2006.01) |
| *H03F 3/19* | (2006.01) |
| *H03F 1/02* | (2006.01) |
| *H03F 1/30* | (2006.01) |
| *H03F 3/24* | (2006.01) |

(52) U.S. Cl.
CPC .. *H03F 3/68* (2013.01); *H03F 3/04* (2013.01); *H03F 3/19* (2013.01); *H03F 1/0288* (2013.01); *H03F 1/306* (2013.01); *H03F 3/245* (2013.01); *H03F 2200/15* (2013.01); *H03F 2200/18* (2013.01)
USPC .......................................... 330/296; 330/285

(58) Field of Classification Search
USPC .................................................. 330/296, 285
See application file for complete search history.

(56) References Cited

U.S. PATENT DOCUMENTS

| | | | | |
|---|---|---|---|---|
| 4,511,813 | A | * | 4/1985 | Pan ................................ 327/431 |
| 4,591,803 | A | * | 5/1986 | Saleh ............................ 330/277 |
| 5,412,235 | A | * | 5/1995 | Nakajima et al. .............. 257/272 |
| 5,949,287 | A | * | 9/1999 | Kurusu et al. .................. 330/277 |

FOREIGN PATENT DOCUMENTS

| | | |
|---|---|---|
| JP | 05-25812 U | 4/1993 |
| JP | 06-140582 | 5/1994 |

* cited by examiner

*Primary Examiner* — Henry Choe
(74) *Attorney, Agent, or Firm* — Fujitsu Patent Center

(57) ABSTRACT

In an amplification device, an amplification unit has a transistor and amplifies a signal that is input. A control unit applies, when a power source is turned on, a pinch-off voltage to a gate of the transistor before applying a drain bias voltage to a drain of the transistor and then applies a gate bias voltage to the gate of the transistor.

4 Claims, 7 Drawing Sheets

AMPLIFICATION DEVICE AND AMPLIFICATION METHOD

CROSS-REFERENCE TO RELATED APPLICATION

This application is based upon and claims the benefit of priority of the prior Japanese Patent Application No. 2012-030046, filed on Feb. 15, 2012, the entire contents of which are incorporated herein by reference.

FIELD

The embodiments discussed herein relate to an amplification device and an amplification method for amplifying a signal.

BACKGROUND

At present, a number of signal amplification transistors are used in the radio frequency (RF) unit of a mobile communication base station, such as an eNB (evolved Node B) and RRH (Remote Radio Head). The kind of main transistor used in the radio frequency unit includes an LDMOS (Laterally Diffused Metal Oxide Semiconductor), GaN, GaAs, etc.

The stability of operation of these transistors is ensured in their operating voltage range, however, some transistors may become unstable during transition of power source when they are powered up. Because of this, if an amplification device satisfies a condition of oscillation when a transistor becomes unstable, for example, an instantaneous spurious is generated. Alternatively, the amplification device issues a device alarm etc. due to a rise in current during transition.

Some existing monolithic integrated circuits (IC) are designed to include a built-in power sequence control. This circuit design is intended to reduce the size of devices using IC chips by integrating the function of controlling power sequence into the chips themselves (for example, see Japanese Laid-open Patent Publication No. 06-140582).

As described above, some transistors may become unstable during transition of power source when they are powered up. Because of this, there has been such a problem that an amplification device may satisfy the condition of oscillation due to the unstable operation of the transistor.

SUMMARY

In an aspect, an amplification device that amplifies a signal includes an amplification unit having a transistor and configured to amplify the signal, and a control unit configured to, when a power source is turned on, apply a pinch-off voltage to a gate of the transistor before applying a drain bias voltage to a drain of the transistor, and then to apply a gate bias voltage to the gate of the transistor.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1A:
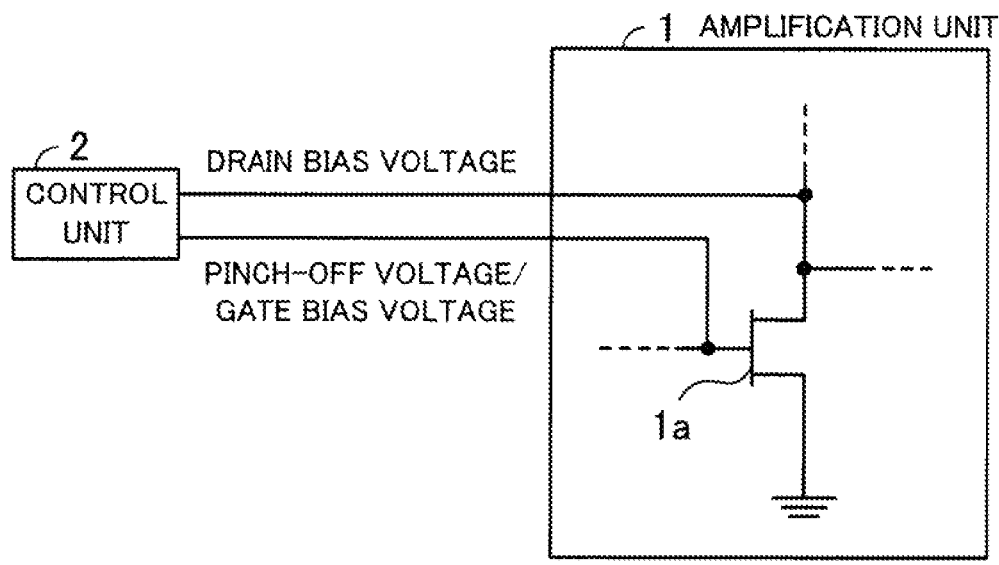
FIGS. 1A and 1B explain an amplification device according to a first embodiment.

Several embodiments will be described below with reference to the accompanying drawings, wherein like reference numerals refer to like elements throughout.

(First Embodiment)

Figure 1B:
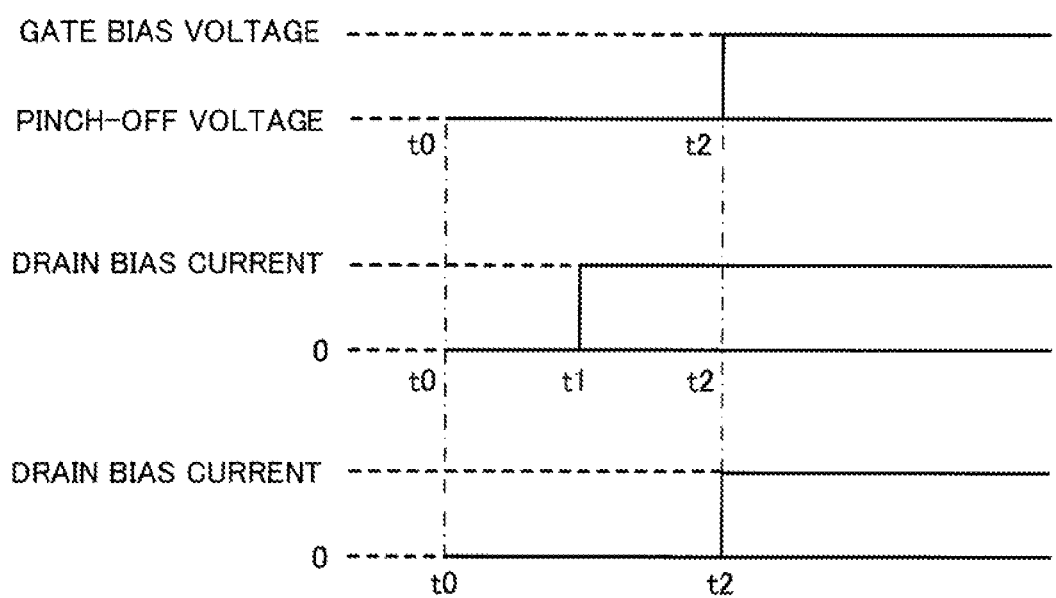

FIG. 1A explains an amplification device according to a first embodiment. As illustrated in FIG. 1A, the amplification device has an amplification unit 1 and a control unit 2. FIG. 1B illustrates a timing chart of a gate bias voltage, a pinch-off voltage, a drain bias voltage, and a drain bias current.

The amplification unit 1 has a transistor 1a and amplifies and outputs a signal that is input.

When the power source for the amplification device is turned on, the control unit 2 first applies a pinch-off voltage to the gate of the transistor 1a in the amplification unit 1 before applying a drain bias voltage to the drain of the transistor 1a. The control unit 2 then applies a gate bias voltage to the gate of the transistor 1a.

Here, the gate bias voltage and the pinch-off voltage of the timing chart indicate the gate bias voltage and the pinch-off voltage applied to the gate of the transistor 1a. The drain bias voltage of the timing chart indicates the drain bias voltage applied to the drain of the transistor 1a. The drain bias current of the timing chart indicates the drain bias current flowing through the drain of the transistor. Time t0 of the timing chart illustrated in FIG. 1B indicates the time when the power source for the amplification device is turned on.

The control unit 2 applies the pinch-off voltage to the gate of the transistor 1a after time t0 (after the power source for the amplification device is turned on) as indicated by the pinch-off voltage of the timing chart.

As indicated by the drain bias voltage of the timing chart, the control unit 2 applies the drain bias voltage to the drain of the transistor 1a at time t1 (t1>t0).

To the gate of the transistor 1a, the pinch-off voltage is applied, and therefore, even if the drain bias voltage is applied to the drain of the transistor 1a, the drain bias current does not flow through the drain of the transistor 1a.

As indicated by the gate bias voltage of the timing chart, the control unit 2 applies the gate bias voltage to the gate of the transistor 1a at time t2 (t2>t1). Due to this, the drain bias current flows through the drain of the transistor 1a, as indicated by the drain bias current of the timing chart.

Figure 2:
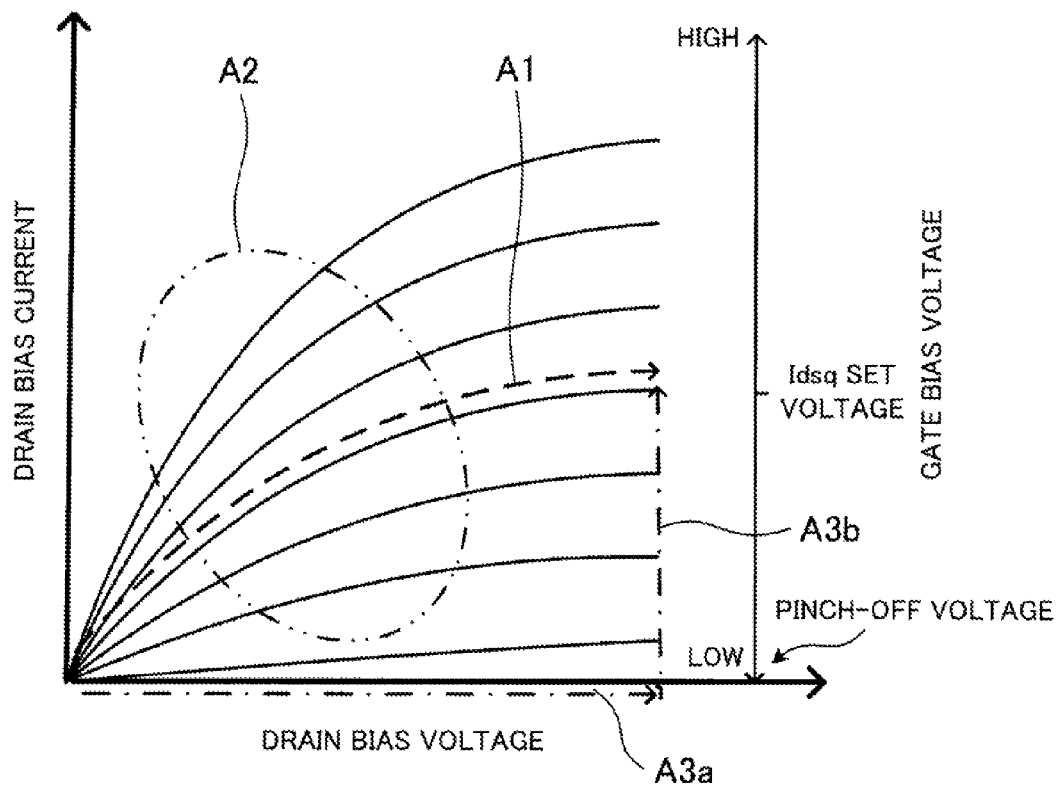
FIG. 2 illustrates an I-V curve of a transistor.

FIG. 2 illustrates an I-V curve of a transistor. The horizontal axis of the I-V curve illustrated in FIG. 2 represents the drain bias voltage and the vertical axis represents the drain bias current. In the transistor 1a, the magnitude of the drain bias current (Idsq) flowing through the drain differs depending on the magnitude of the gate bias voltage.

In the conventional voltage application method, a gate bias voltage (Idsq set voltage) is first applied to the gate of the transistor 1a of FIG. 1A. Next, a drain bias voltage is applied to the drain of the transistor 1a.

Due to this sequence, the drain bias current flowing through the drain of the transistor 1a changes as the drain bias voltage rises until a desired drain bias current in accordance with the Idsq set voltage is obtained, as indicated by a locus A1 of FIG. 2.

A two-dot chain line A2 of FIG. 2 indicates an unstable region of the transistor 1a. When the I-V curve of the transistor 1a passes through the region of the two-dot chain line A2, the operation of the transistor 1a becomes unstable.

When the operation of the transistor 1a becomes unstable, the transistor 1a and other circuits (not illustrated in FIG. 1A) constituting the amplification device may happen to satisfy the condition of oscillation and oscillate.

Because of this, when the power source for the amplification device is turned on, the control unit 2 of FIG. 1A first applies the pinch-off voltage to the gate of the transistor 1a in the amplification unit 1 before applying the drain bias voltage to the drain of the transistor 1a. The control unit 2 then applies the gate bias voltage (Idsq set voltage) to the gate of the transistor 1a.

Due to this, when the power source for the amplification device is turned on, even if the drain bias voltage is applied, the drain bias current does not flow through the drain of the transistor 1a because of the pinch-off voltage input to the gate. That is, the relationship between the drain bias voltage and the drain bias current of the transistor 1a changes as indicated by a locus A3a.

Then, the control unit 2 applies the gate bias voltage (for example, the Idsq set voltage) to the gate of the transistor 1a. Due to this, the drain bias current of the transistor 1a changes as indicated by a locus A3b.

That is, in the amplification device of FIG. 1A, the I-V curve of the transistor 1a does not pass through the unstable region indicated by the two-dot chain line A2. In other words, in the amplification device of FIG. 1A, it is possible to avoid the unstable operation of the transistor 1a when the power source is turned on, and therefore, to avoid oscillation.

As described above, when the power source is turned on, the control unit 2 of the amplification device applies the pinch-off voltage to the gate of the transistor 1a in the amplification unit 1 before applying the drain bias voltage to the drain of the transistor 1a. The control unit 2 then applies the gate bias voltage to the gate of the transistor 1a. It is therefore possible for the transistor 1a to start up without passing through the unstable region after the power source is turned on. The amplification device thus avoids oscillation.

(Second Embodiment)

Next, a second embodiment will be described below in detail with reference to the accompanying drawings.

Figure 3:
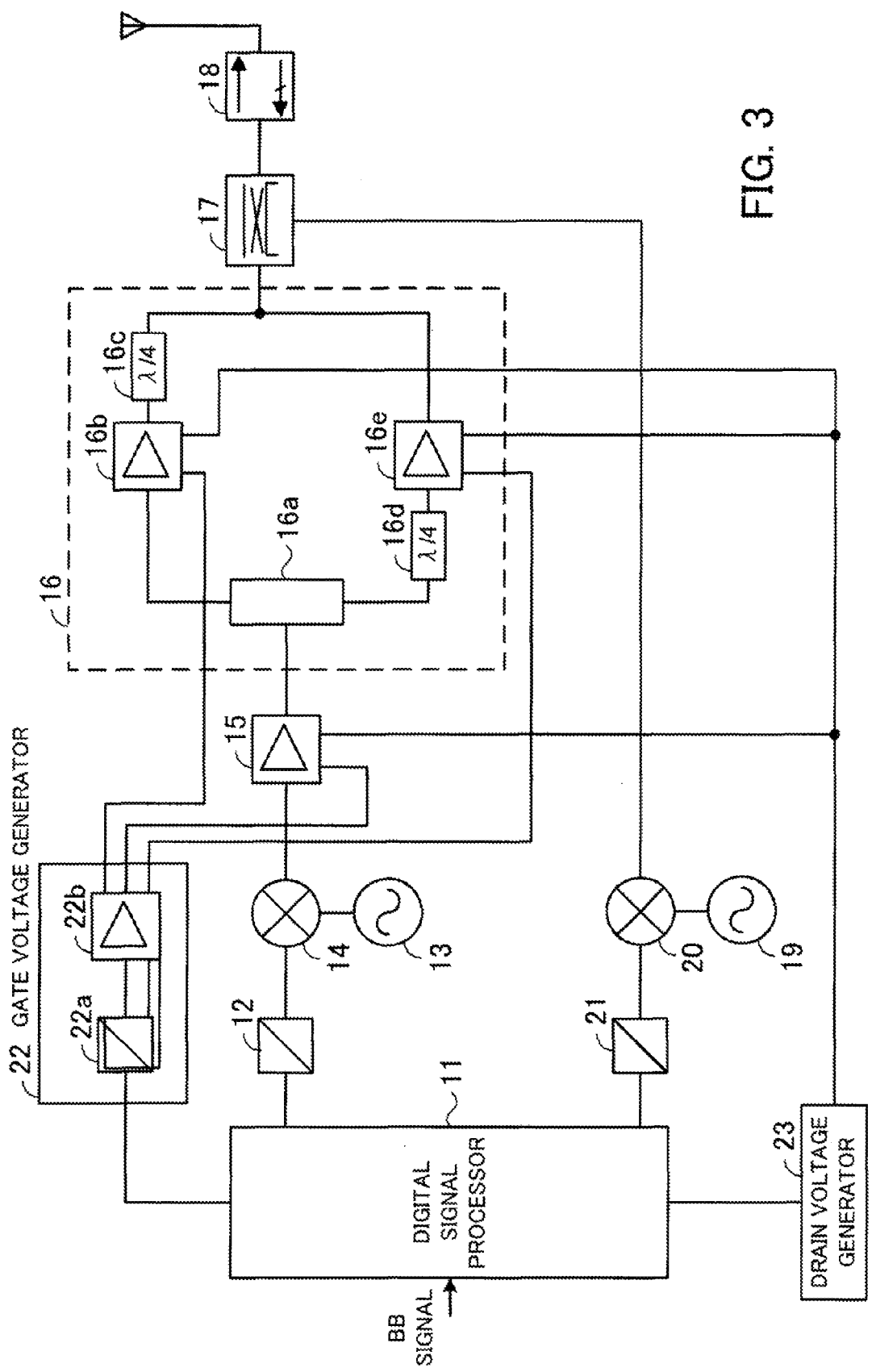
FIG. 3 illustrates an amplification device according to a second embodiment.

FIG. 3 illustrates an amplification device according to the second embodiment. As illustrated in FIG. 3, the amplification device has a digital signal processor 11, a DAC (Digital to Analog Converter) 12, oscillators 13 and 19, multipliers 14 and 20, an amplifier 15, a Doherty amplifier 16, a coupler 17, an isolator 18, an ADC (Analog to Digital Converter) 21, a gate voltage generator 22, and a drain voltage generator 23. The amplification device illustrated in FIG. 3 is mounted on, for example, an eNB and RRH.

To the digital signal processor 11, for example, a base band signal (BB signal) transmitted to a wireless terminal, such as a mobile telephone, is input. Further, to the digital signal processor 11, a feedback signal of the signal wirelessly transmitted to the wireless terminal is input via the coupler 17, the multiplier 20, and the ADC 21.

In the signal transmitted to the wireless terminal, distortion is caused by the amplifier 15 and the Doherty amplifier 16. The digital signal processor 11 calculates a distortion compensation coefficient to perform distortion compensation for the signal wirelessly transmitted to the wireless terminal and multiplies the base band signal that is input by the calculated distortion compensation coefficient to compensate for the distortion of the signal. The digital signal processor 11 calculates the distortion compensation coefficient based on the base band signal and the feedback signal that are input.

The digital signal processor 11 is formed by, for example, an ASIC (Application Specific Integrated Circuit), FPGA (Field Programmable Gate Array), CPU (Central Processing Unit), or DSP (Digital Signal Processor).

The DAC 12 converts the digital base band signal output from the digital signal processor 11 into an analog base band signal and outputs the base band signal to the multiplier 14.

The multiplier 14 multiplies the base band signal output from the DAC 12 by the oscillation signal output from the oscillator 13 and frequency-converts the base band signal output from the DAC 12 into a radio frequency. The oscillator 13 is, for example, a PLL (Phase Locked Loop) oscillator.

The amplifier 15 has a transistor of LDMOS, GaN, or GaAs and amplifies a signal output from the multiplier 14.

The Doherty amplifier 16 amplifies the signal output from the amplifier 15 to desired power and outputs the signal to the coupler 17. The Doherty amplifier 16 has a distributor 16a, a carrier amplifier 16b, λ/4 lines (in FIG. 3, λ/4) 16c and 16d, and a peak amplifier 16e.

The distributor 16a performs power distribution of the signal output from the amplifier 15 and outputs the signal to the carrier amplifier 16b and the peak amplifier 16e. The carrier amplifier 16b and the peak amplifier 16e have the transistor of LDMOS, GaN, or GaAs configured to amplify a signal.

The signal output from the carrier amplifier 16b is delayed 90 degrees in phase by the λ/4 line 16c. The λ/4 line 16d delays the signal input to the peak amplifier 16e 90 degrees in phase. Due to this, the signal output from the λ/4 line 16c and the signal output from the peak amplifier 16e are combined in the same phase and output to the coupler 17.

The carrier amplifier 16b operates in class A to class AB and the peak amplifier 16e operates in high efficient class C. In the Doherty amplifier 16, until the input signal level exceeds the pinch-off voltage of the peak amplifier 16e, the carrier amplifier 16b operates alone. At this time, the impedance when viewed from the output of the carrier amplifier 16b is, for example, 2Zo if it is assumed that the impedance of the load connected to the Doherty amplifier 16 is Zo/2.

In the Doherty amplifier 16, when the level of the input signal exceeds the pinch-off voltage of the peak amplifier 16e, the peak amplifier 16e starts to operate and drives the load together with the carrier amplifier 16b. At this time, the impedance when viewed from the output of the carrier amplifier 16b is reduced to Zo and the carrier amplifier 16b operates with the maximum efficiency in order to keep the output voltage constant.

The coupler 17 outputs the signal amplified by the Doherty amplifier 16 to the isolator 18 and at the same time, outputs part of the signal to the multiplier 20.

The isolator 18 outputs the signal output from the coupler 17 to an antenna. Further, the isolator 18 outputs the signal received via the antenna to a receiver, not illustrated in FIG. 3. The receiver, for example, demodulates the signal received from the wireless terminal via the antennal and outputs the result for delivery to an upper device linked to the eNB or RRH.

The multiplier 20 multiplies the signal output from the coupler 17 by the oscillation signal output from the oscillator 19 and frequency-converts the signal output from the coupler 17 into the frequency of a base band signal.

The ADC 21 converts the analog signal output from the multiplier 20 into a digital signal and outputs the digital signal to the digital signal processor 11.

The gate voltage generator 22 generates the pinch-off voltage and the gate bias voltage for the transistor of the amplifier 15 and the transistors of the carrier amplifier 16b and the peak amplifier 16e of the Doherty amplifier 16 in response to the control of the digital signal processor 11. The gate voltage generator 22 has a DAC 22a and an operational amplifier circuit 22b. In the following, the three transistors, that is, the transistor in the amplifier 15 and the transistors in the carrier amplifier 16b and the peak amplifier 16e of the Doherty amplifier 16 are sometimes referred to simply as the transistor of amplifier or the three transistors.

The drain voltage generator 23 generates the drain bias voltage of the transistor of amplifier in response to the control of the digital signal processor 11.

The amplifier 15 and the Doherty amplifier 16 illustrated in FIG. 3 correspond to, for example, the amplification unit 1 illustrated in FIG. 1A. The digital signal processor 11, the gate voltage generator 22, and the drain voltage generator 23 illustrated in FIG. 3 correspond to, for example, the control unit 2 illustrated in FIG. 1A.

When the power source for the amplification device is turned on, the digital signal processor 11 controls the gate voltage generator 22 so as to apply the pinch-off voltage to the gate of the transistor of amplifier.

Next, the digital signal processor 11 controls the drain voltage generator 23 so as to apply the drain bias voltage to the drain of the transistor of amplifier.

Next, the digital signal processor 11 controls the gate voltage generator 22 so as to apply the gate bias voltage (Idsq set voltage) to the gate of the transistor of amplifier.

Due to this, the I-V curve of the transistor of amplifier changes, for example, as indicated by the loci A3a and A3b of FIG. 2 and through the drain of the transistor, the drain bias current in accordance with the Idsq set voltage flows.

Figure 4:
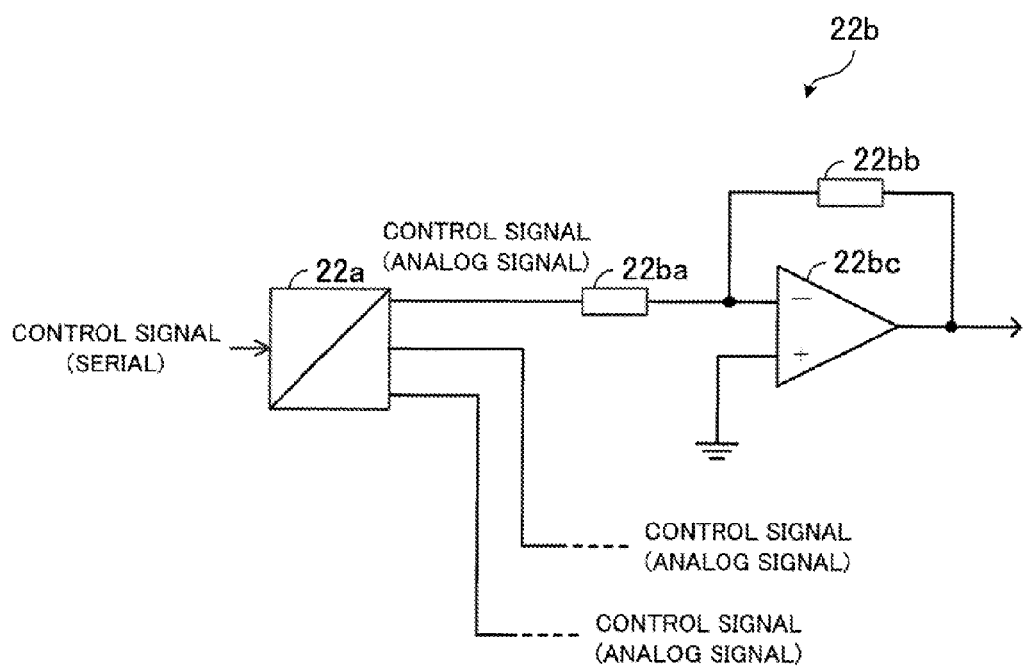
FIG. 4 illustrates a circuit example of a gate voltage generator.

FIG. 4 illustrates a circuit example of the gate voltage generator. FIG. 4 illustrates the DAC 22a and the operational amplifier circuit 22b illustrated in FIG. 3. The three operational amplifier circuits 22b are provided in correspondence to the three transistors of the amplifier 15 and the Doherty amplifier 16. However, FIG. 4 illustrates only the operational amplifier circuit 22b corresponding to the transistor of the amplifier 15.

After the power source for the amplification device is turned on, the digital signal processor 11 outputs a serial control signal (digital signal) to the DAC 22a to apply the pinch-off voltage to the gates of the three transistors. After this, the digital signal processor 11 further outputs a serial control signal to the DAC 22a to apply the gate bias voltage to the gates of the three transistors.

The DAC 22a converts the serial control signals corresponding to the three transistors, which are output from the digital signal processor 11, into analog signals. The three control signals converted into analog signals are output to the operational amplifier circuit 22b corresponding to the amplifier 15 and operational amplifier circuits, not illustrated, corresponding to the carrier amplifier 16b and the peak amplifier 16e of the Doherty amplifier 16.

The operational amplifier circuit 22b has resistors 22ba and 22bb, and an operational amplifier 22bc. To the resistor 22ba, the control signal converted into the analog signal is input.

The operational amplifier circuit 22b amplifies the control signal that is input based on Formula (1) below.

$$G = -(R2/R1) \quad (1)$$

G in Formula (1) stands for gain. R1 represents the resistance value of the resistor 22ba and R2 represents the resistance value of the resistor 22bb.

The control signal amplified based on Formula (1) is output to the gate of the transistor of the amplifier 15. The other two operational amplifier circuits, not illustrated in FIG. 4, also amplify the control signals similarly and output the control signals to the gates of the transistors in the carrier amplifier 16b and the peak amplifier 16e of the Doherty amplifier 16.

Returning to explanation of FIG. 3, the digital signal processor 11 controls the drain voltage generator 23 by, for example, a serial digital signal. In the serial digital signal output from the digital signal processor 11, a signal to generate the drain bias voltage of the three transistors (hereinafter, sometimes referred to as a control signal) is included. The drain voltage generator generates the drain bias voltage of the three transistors in response to the control signal output from the digital signal processor 11.

Figure 5:
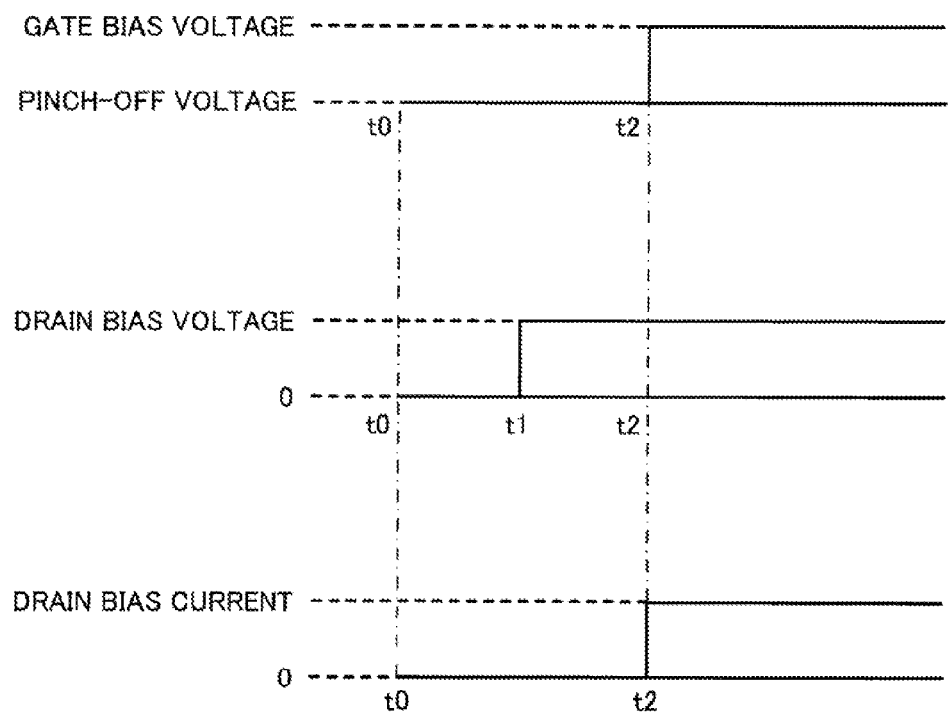
FIG. 5 illustrates a time chart of a gate bias voltage, a pinch-off voltage, a drain bias voltage, and a drain bias current.

FIG. 5 illustrates a time chart of the gate bias voltage, the pinch-off voltage, the drain bias voltage, and the drain bias current.

It is assumed that the power source for the amplification device illustrated in FIG. 3 is turned on at time t0 illustrated in FIG. 5. After the power source is turned on, as indicated by the pinch-off voltage of FIG. 5, the digital signal processor 11 causes the pinch-off voltage to be applied to each gate of the three transistors.

As indicated by the drain bias voltage of FIG. 5, the digital signal processor 11 causes the drain bias voltage to be applied to the drains of the three transistors at time t1 (t1>t0). After that, as indicated by the gate bias voltage of FIG. 5, the digital signal processor 11 causes the gate bias voltage to be applied to each gate of the three transistors at time t2 (t2>t1).

Due to this, as indicated by the drain bias current of FIG. 5, through the drains of the three transistors, the drain bias current flows at time t2.

Figure 6:
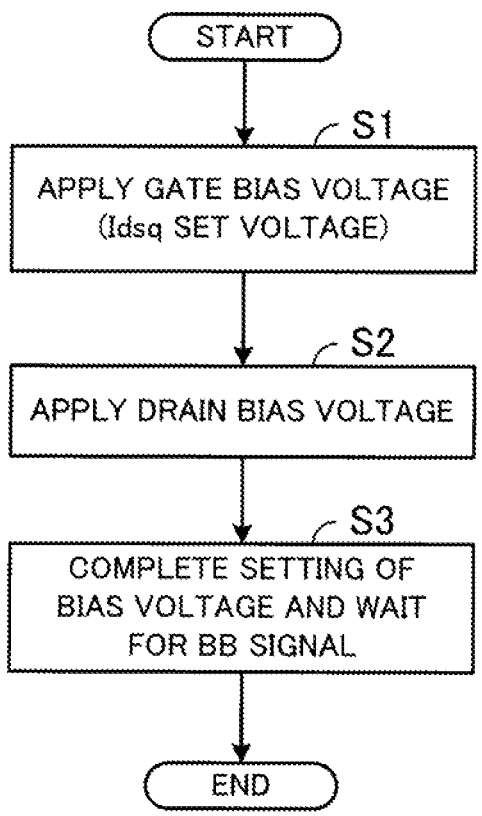
FIG. 6 is a flowchart illustrating voltage control by which a transistor becomes unstable.

FIG. 6 is a flowchart illustrating voltage control by which the transistor becomes unstable. The digital signal processor 11 of FIG. 3 does not perform the operation of the flowchart of FIG. 6 originally, however, it is assumed that the digital signal processor 11 performs the following operation in order to explain the voltage control by which the transistor becomes unstable. After the power source for the amplification device is turned on, the digital signal processor 11 performs processing of steps illustrated below.

(Step S1) The digital signal processor 11 applies the gate bias voltage (Idsq set voltage) to the gates of the three transistors.

(Step S2) The digital signal processor 11 applies the drain bias voltage to the drains of the three transistors.

(Step S3) The digital signal processor 11 completes the setting of the bias voltage and waits for the input of a BB signal.

By the above operation, after the power source is turned on, the drain bias current of the transistor changes as indicated by the locus A1 of FIG. 2, and passes through the unstable region indicated by the two-dot chain line A2. Because of this, the operation of the transistor becomes unstable, and the transistor and other circuits constituting the amplification device may happen to satisfy the condition of oscillation. The oscillation of the amplification device may result in an instantaneous radiation of spurious. Such generation of instantaneous spurious could violate the radio regulations.

Further, when the operation of the transistor becomes unstable and the amplification device satisfies the condition of oscillation, a device alarm may be issued by a rise in current during transition. The device alarm due to a rise in current during transition is an obstacle when bringing the amplification device into the operating state.

It is also possible to design the peripheral circuits in the stage of design so that the transistors of the amplifier 15 and the Doherty amplifier 16 do not satisfy the condition of oscillation in the unstable region even when performing the above-mentioned voltage control.

However, when the above-mentioned voltage control is performed using a transistor that is mass-produced, the transistor and other circuits of the amplifier 15 and the Doherty amplifier 16 may vary and satisfy the condition of oscillation. In such a case, urgent modification of the design becomes necessary and in the meantime, for example, there arises a situation in which the manufacture of the amplification device needs to be suspended.

Figure 7:
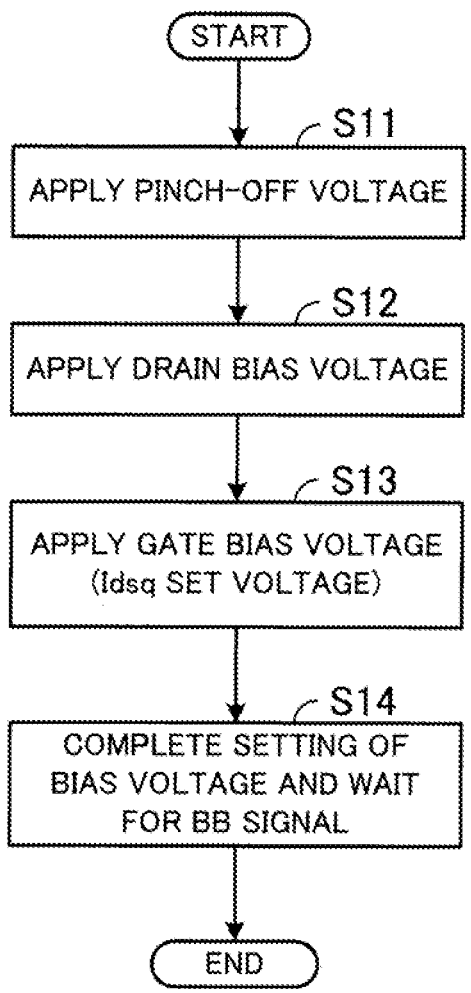
FIG. 7 is a flowchart illustrating voltage control by which a transistor does not become unstable.

FIG. 7 is a flowchart illustrating voltage control by which the transistor does not become unstable. That is, the flowchart of FIG. 7 illustrates the original operation of the digital signal processor 11 of FIG. 3. After the power source for the amplification device is turned on, the digital signal processor 11 performs processing of steps illustrated below.

(Step S11) The digital signal processor 11 applies the pinch-off voltage to the gates of the three transistors.

(Step S12) The digital signal processor 11 applies the drain bias voltage to the drains of the three transistors.

(Step S13) The digital signal processor 11 applies the gate bias voltage (Idsq set voltage) to the gates of the three transistors. Due to this, through the drains of the three transistors, the drain bias current in accordance with the Idsq set voltage flows.

(Step S14) The digital signal processor 11 completes the setting of the bias voltage and waits for the input of a BB signal.

By the above operation, after the power source is turned on, the drain bias current of the transistor changes as indicated by the loci A3a and A3b of FIG. 2 and does not pass through the unstable region illustrated by the two-dot chain line A2.

As described above, when the power source is turned on, the digital signal processor 11 of the amplification device applies the pinch-off voltage to the gates of the transistors in the amplifier 15 and the Doherty amplifier 16 before applying the drain bias voltage to the drain of the transistor. The digital signal processor 11 then applies the gate bias voltage to the gate of the transistor.

Due to this, it is possible for the amplification device to avoid oscillation of the transistors of the amplifier 15 and the Doherty amplifier 16 after the power source is turned on.

Further, it is possible for the amplification device to avoid the generation of spurious and the issuance of alarm due to a rise in current by avoiding the oscillation of the transistor. Furthermore, it is possible to avoid the violation of the radio regulations and the obstacle when bringing the amplification device into the operating state by avoiding the generation of spurious and the issuance of alarm due to a rise in current.

Still furthermore, it is possible for the amplification device to avoid the oscillation of the transistor even when using a transistor that is mass-produced in the amplifier 15 and the Doherty amplifier 16.

In the above, the voltages of the three transistors of the amplifier 15 and the Doherty amplifier 16 are controlled. However, it may also be possible to control the voltage of one of the transistors of the amplifier 15 and the Doherty amplifier 16. For example, if the transistor does not satisfy the condition of oscillation even when the transistor becomes unstable in the amplifier 15, it may also be possible for the digital signal processor 11 to control only the voltage of the transistor of the Doherty amplifier 16.

Further, when the output voltage of the DAC 22a has a magnitude enough to drive the gate of the transistor, the operational amplifier circuit 22b is not necessary.

In the above, the digital signal processor 11 that processes a BB signal is caused to perform voltage control of the transistor. However, it may also be possible to cause a control unit different from the digital signal processor 11 to perform voltage control of the transistor. In this case, it is possible to form the control unit by, for example, an ASIC, FPGA, CPU, or DSP.

According to the disclosed device and method, it is possible to avoid oscillation after the power source is turned on.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An amplification device that amplifies a signal, comprising:
    an amplification unit having a transistor and configured to amplify the signal; and
    a control unit configured to, when a power source is turned on, apply a pinch-off voltage to a gate of the transistor before applying a drain bias voltage to a drain of the transistor and then to apply a gate bias voltage to the gate of the transistor.

2. The amplification device according to claim 1, further comprising a generator configured to generate the pinch-off voltage, the drain bias voltage, and the gate bias voltage in response to control of the control unit.

3. The amplification device according to claim 2, wherein:
    the amplification unit includes
        a radio signal amplifier configured to amplify the signal converted into a radio frequency, and
        a Doherty amplifier configured to amplify the signal amplified by the radio signal amplifier; and
    the generator generates the pinch-off voltage, the drain bias voltage, and the gate bias voltage for each of the transistor of the radio signal amplifier and the transistor of the Doherty amplifier.

4. An amplification method of an amplification device that amplifies a signal, the method comprising:
    applying, when a power source is turned on, a pinch-off voltage to a gate of a transistor in an amplification unit configured to amplify the signal; and
    applying a drain bias voltage to a drain of the transistor and a gate bias voltage to the gate of the transistor after applying the pinch-off voltage.

* * * * *